(12) United States Patent
Takeda

(10) Patent No.: US 7,570,044 B2
(45) Date of Patent: Aug. 4, 2009

(54) SIGNAL DETECTING CIRCUIT

(75) Inventor: Toru Takeda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 22 days.

(21) Appl. No.: 12/033,171

(22) Filed: Feb. 19, 2008

(65) Prior Publication Data
US 2008/0197834 A1 Aug. 21, 2008

(30) Foreign Application Priority Data
Feb. 19, 2007 (JP) .............................. 2007-037898

(51) Int. Cl.
G01R 15/20 (2006.01)
G01R 33/07 (2006.01)
G01R 33/06 (2006.01)
(52) U.S. Cl. .................................. 324/117 H; 324/251
(58) Field of Classification Search ............. 324/117 H, 324/251
See application file for complete search history.

(56) References Cited

U.S. PATENT DOCUMENTS 5,621,319 A * 4/1997 Bilotti et al. ................ 324/251
6,674,322 B2 1/2004 Motz
6,777,932 B2 8/2004 Hara et al.
6,794,863 B2 9/2004 Hatanaka

FOREIGN PATENT DOCUMENTS

JP 2001-337147 12/2001
JP 2004-340782 12/2004

* cited by examiner

Primary Examiner—Ha Tran T Nguyen
Assistant Examiner—Roberto Velez
(74) Attorney, Agent, or Firm—Turocy & Watson, LLP

(57) ABSTRACT

The signal detecting circuit has a first amplifier which amplifies the supplied signals and outputs the amplified signals from first and second output terminals; a switch unit which supplies the signals to the first amplifier such that the polarity thereof is reversed between the first and second periods; a first capacitor, one end of which is connected to the first output terminal; a second capacitor, one end of which is connected to the second output terminal; a first switch, one end of which is connected to the other end of the second capacitor; a second amplifier having an inverting input terminal connected to the other end of the first capacitor, a non-inverting input terminal connected to the other end of the first switch, and an output terminal; a second switch which is connected to between the output terminal and the inverting input terminal, a third switch, one end of which is connected to the other end of the second capacitor; a fourth switch, one end of which is connected to the other end of the non-inverting input terminal; a threshold voltage source which is connected to between the other end of the third switch and the other end of the fourth switch; and a reference voltage source which is connected to either one of the other end of the third switch and the other end of the fourth switch. In the first period, the first switch is off, and the second to fourth switches are on; in the second period, the first switch is on, and the second to fourth switches are off.

13 Claims, 8 Drawing Sheets

SIGNAL DETECTING CIRCUIT

CROSS REFERENCE TO RELATED APPLICATIONS

This application is based upon and claims benefit of priority from the Japanese Patent Application No. 2007-37898, filed on Feb. 19, 2007, the entire contents of which are incorporated herein by reference.

BACKGROUND OF THE INVENTION

The present invention relates to a signal detecting circuit.

A magnetic detecting circuit for detecting a magnetic field in a predetermined position by a Hall element using a Hall effect is used as a position sensor such as an open/close detecting device installed in a foldable mobile phone. The magnetic detecting circuit includes a Hall element which outputs a voltage in proportion to a magnetic field or a magnetic flux density; an amplifier which amplifies an output voltage from the Hall element; and a comparator which determines the presence or absence of an output from the Hall element based on an output from the amplifier.

The magnetic detecting circuit can be made of silicon to be formed into a one-chip Hall IC, which is favorable for device miniaturization. Here, a silicon Hall element outputs a very small voltage, which causes a problem with noise in the detecting circuit or an offset voltage of the amplifier or the comparator.

As a magnetic field sensor for reducing the influence of the input offset voltage in the amplifier, there has been proposed a magnetic field sensor which includes: a Hall element; a switching circuit for outputting the output voltage from the Hall element by switching so as to reverse the polarity at a first timing and at a second timing; an amplifier for outputting by amplifying an output from the switching circuit; a capacitor, one end of which is connected to an output terminal of the amplifier and holds an output voltage from the amplifier; and a switch which is connected to between the other end of the capacitor and the other output terminal of the amplifier (for example, see Japanese Patent No. 3315397).

Assuming that an amplification factor of the amplifier is $\beta$, and an input offset voltage is Voff, an output voltage Vh from the Hall element is inputted into the amplifier at a first timing, and a voltage $V1=\beta(Vh+Voff)$ is outputted. When the switch is closed, the voltage V1 is stored in the capacitor.

Then, at a second timing, an output voltage −Vh' having a reverse polarity to the one at the first timing is inputted from the Hall element into the amplifier. When the switch is opened, a voltage $V2=\beta(-Vh'+Voff)$ is outputted from the amplifier. Here, the output V from the magnetic sensor is the sum of the voltage V2 and the voltage −V1 of amplifier-side terminal of the capacitor.

As a result, $V=V2+(-V1)=-\beta(Vh+Vh')$ is obtained, which indicates that the influence of the input offset voltage Voff in the amplifier is cancelled.

In addition, the output voltages Vh and Vh' from the Hall element contain an in-phase effective signal component and an anti-phase element offset voltage. Thus, by adding Vh and Vh', it is possible to cancel the influence due to the element offset voltage of the Hall element as well.

However, there is a problem in that the magnetic detecting circuit using this magnetic sensor does not have a function to cancel the offset voltage of the comparator, thereby producing an inconsistent comparison value.

SUMMARY OF THE INVENTION

According to one aspect of the present invention, there is provided a signal detecting circuit comprising:

a first signal input terminal and a second signal input terminal;

a first amplifier which has a first input terminal and a second input terminal and a first output terminal and a second output terminal, and which amplifies the signals inputted from said first input terminal and said second input terminal respectively and outputs the amplified signals from said first output terminal and said second output terminal;

a switch unit which connects the first input terminal of said first amplifier to said first signal input terminal, and said second input terminal to said second signal input terminal in a first period; and connects the second input terminal of said first amplifier to said first signal input terminal, and the first input terminal to said second signal input terminal in a second period;

a first capacitor, one end of which is connected to said first output terminal;

a second capacitor, one end of which is connected to said second output terminal;

a first switch, one end of which is connected to the other end of said second capacitor, and which is off in said first period, and which is on in said second period;

a second amplifier which has an inverting input terminal connected to the other end of said first capacitor, a non-inverting input terminal connected to the other end of said first switch, and a comparison result outputting terminal, and which compares the signals inputted from said inverting input terminal and said non-inverting input terminal respectively and outputs a comparison result from said comparison result outputting terminal;

a second switch which is connected to between said comparison result outputting terminal and said inverting input terminal, and which is on in said first period, and which is off in said second period;

a third switch, one end of which is connected to the other end of said second capacitor and one end of said first switch; and which is on in said first period, and which is off in said second period;

a fourth switch, one end of which is connected to the other end of said first switch and the non-inverting input terminal of said second amplifier; and which is on in said first period, and which is off in said second period;

a threshold voltage source which is connected to between the other end of said third switch and the other end of said fourth switch; and a reference voltage source which is connected to either one of the other end of said third switch and the other end of said fourth switch.

DESCRIPTION OF THE EMBODIMENTS

Hereinafter, the signal detecting circuit in accordance with embodiments of the present invention will be described with reference to drawings.

First Embodiment

Figure 1:
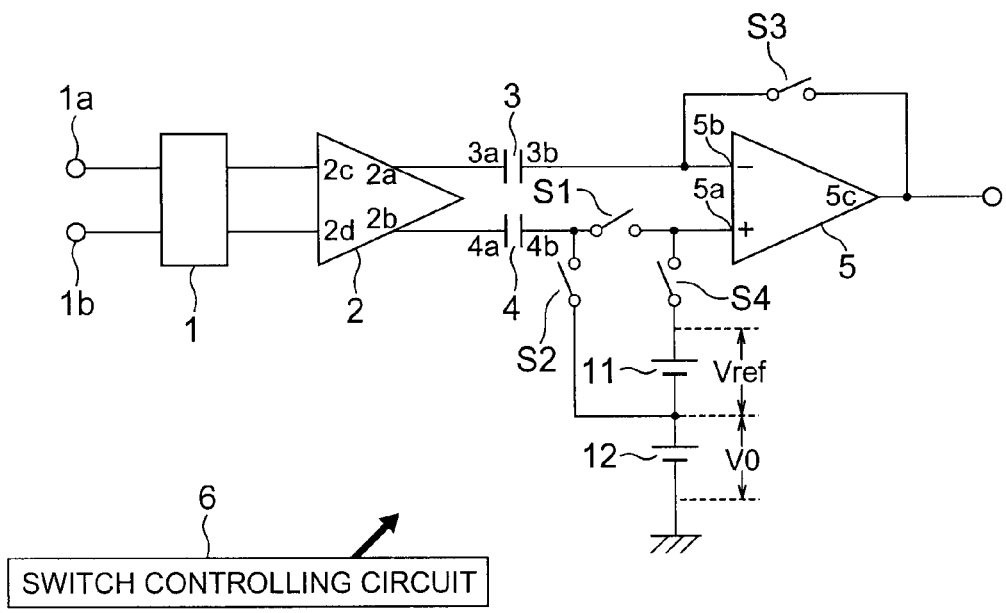
FIG. 1 is a block diagram showing a schematic configuration of a signal detecting circuit in accordance with a first embodiment.

FIG. 1 is a block diagram showing a schematic configuration of a signal detecting circuit in accordance with a first embodiment. The signal detecting circuit includes a switching circuit 1 for switching an output destination of the voltage signal inputted from the input terminals 1a and 1b; an amplifier 2 which receives an output from the switching circuit 1 at terminals 2c and 2d, and then amplifies and outputs from terminals 2a and 2b; a capacitor 3, a terminal 3a of which is connected to the terminal 2a of the amplifier 2; a capacitor 4, a terminal 4a of which is connected to the terminal 2b of the amplifier 2; switches S1 and S2, one end of which is connected to the other terminal 4b of the capacitor 4; an amplifier 5 having a non-inverting input terminal 5a which is connected to the other end of the switch S1 and an inverting input terminal 5b which is connected to the other terminal 3b of the capacitor 3; a switch S3 which is connected to between the output terminal 5c of the amplifier 5, the terminal 4b of the capacitor 4, and the inverting input terminal 5b of the amplifier 5; a switch S4, one end of which is connected to the other end of the switch S1 and the non-inverting input terminal 5a of the amplifier 5; a decision threshold voltage source 11 which is connected to between the other end of the switch S4 and the other end of the switch S2, and has a decision threshold voltage Vref; and a reference voltage source 12 which is connected to the other end of the decision threshold voltage source 11 and the other end of the switch S2, and has a reference voltage V0.

A switch controlling circuit 6 performs a connection switching of the switching circuit 1 and an on/off control of the switches S1 to S4. The decision threshold voltage Vref can be set to an arbitrary value.

Figure 2:
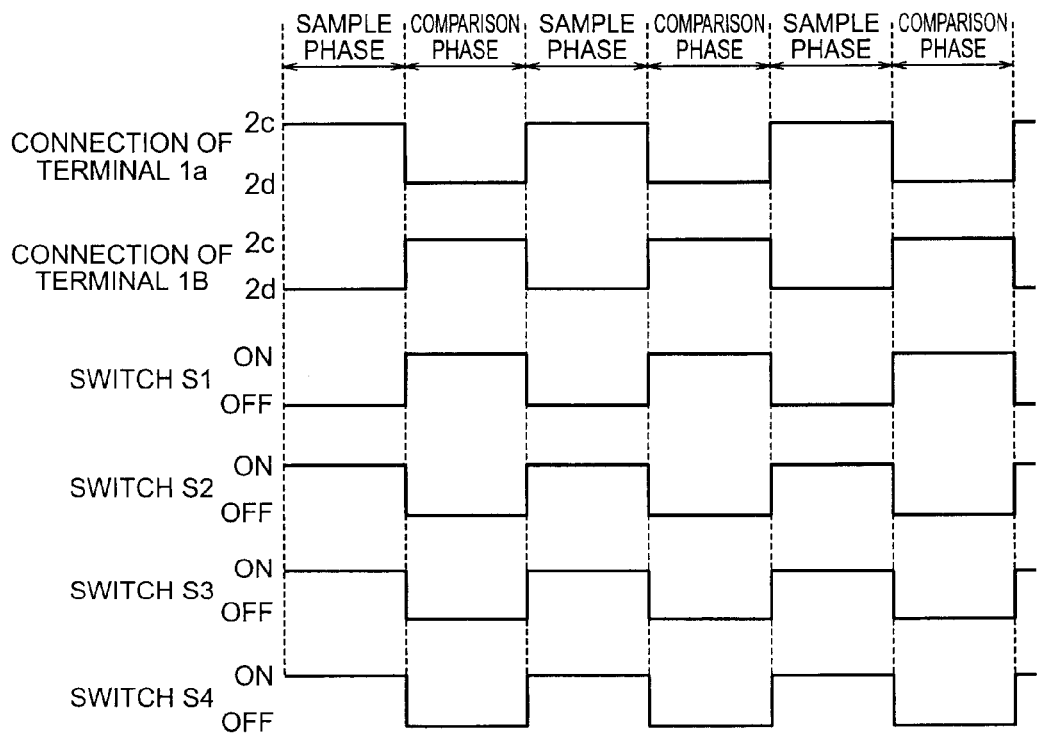
FIG. 2 is a timing chart showing an operation of the signal detecting circuit in accordance with the first embodiment.

FIG. 2 is a timing chart showing a connection state of each switch. As shown in FIG. 2, one cycle of operation consists of a sample phase during which period an offset component is stored, and a comparison phase during which period a comparison result between an input signal and a decision threshold voltage Vref is output.

In the sample phase, the switching circuit 1 enters a connection state in which a signal inputted from the input terminal 1a is applied to the terminal 2c of the amplifier 2, and a signal inputted from the input terminal 1b is applied to the input terminal 2d of the amplifier 2. In this phase, the switch S1 is off, and the switches S2 to S4 are on.

The capacitor 3 holds a difference between a voltage which is inputted from the input terminal 1a and amplified by the amplifier 2 and the decision threshold voltage Vref. The capacitor 4 holds a voltage which is inputted from the input terminal 1b and amplified by the amplifier 2.

In the comparison phase, the switching circuit 1 enters a connection state in which a signal inputted from the input terminal 1a is applied to the terminal 2d of the amplifier 2, and a signal inputted from the input terminal 1b is applied to the terminal 2c of the amplifier 2. In this phase, the switch S1 is on, and the switches S2 to S4 are off.

The difference between the voltages which are held in the capacitors 3 and 4 in the sample phase, and the output voltage from the amplifier 2 is applied to the amplifier 5, and then the amplifier 5 outputs the comparison result. In the sample phase, the switch S3 is on and the amplifier 5 acts as a buffer with all feedback; in the comparison phase, the switch S3 is off and the amplifier 5 acts as a comparator with no feedback.

Each node voltage (potential difference with respect to reference voltage V0) and the voltages which are held in the capacitors 3 and 4 will be described with a focus on a signal component and an offset component thereof as follows. Assume that a voltage applied to the input terminal 1a is Vin1; a voltage applied to the input terminal 1b is Vin2; a gain of the amplifier 2 is Ga; an output voltage from the output terminal 2a of the amplifier 2 is Vout1; an output voltage from the output terminal 2b is Vout2; a gain of the amplifier 5 is Gc; and an output voltage from the amplifier 5 is Vout3.

First, the signal component will be described.

Figure 3A:
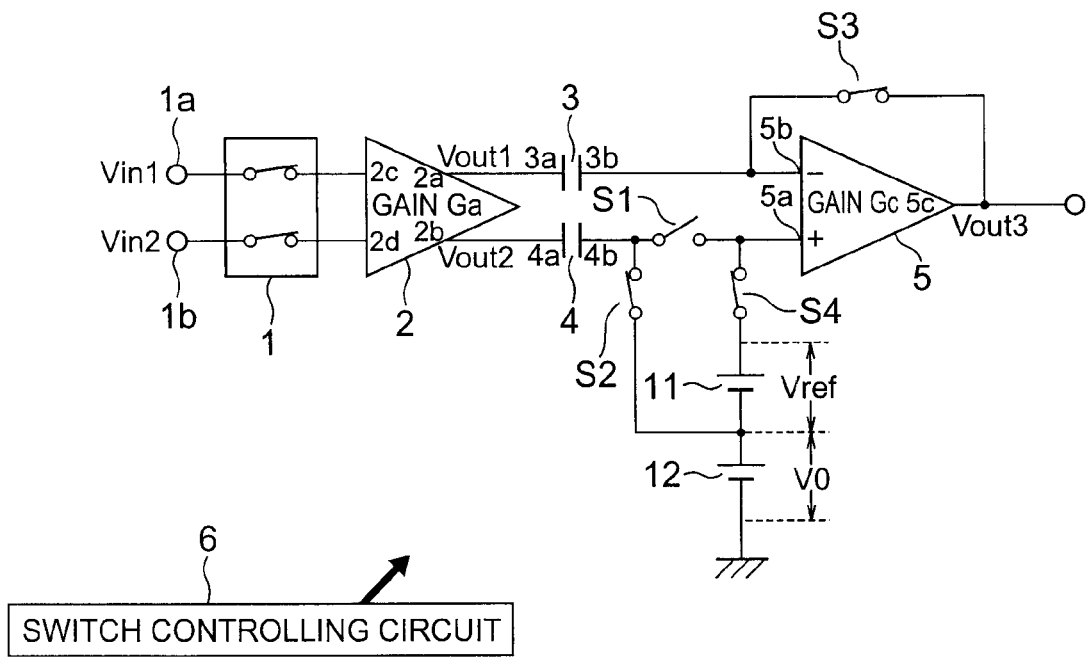
FIG. 3A is a schematic diagram in a sample phase of the signal detecting circuit in accordance with the first embodiment.

FIG. 3A shows a switch connection state in the sample phase. The voltage Vin1 is applied to the input terminal 2c of the amplifier 2; and the voltage Vin2 is applied to the input terminal 2d of the amplifier 2. Accordingly, the output voltages Vout1 and Vout2 from the amplifier 2 are obtained by the following expression respectively:

$$Vout1 = Vin1 \times Ga/2, \quad Vout2 = Vin2 \times Ga/2 \tag{1}$$

Since the switch S1 is off and the switch S4 is on, an input voltage in the non-inverting input terminal 5a of the amplifier 5 is Vref. Since the switch S3 is on, the amplifier 5 acts as a buffer. Thus, the input in the non-inverting input terminal 5a is outputted as is from the output terminal 5c of the amplifier 5. Accordingly, the output voltage Vout3 from the amplifier 5 is as follows:

$$Vout3 = Vref \tag{2}$$

Since the voltage at the terminal 3a side of the capacitor 3 is the output Vout1 from the amplifier 2, and the voltage at the terminal 3b side is the output Vout3 from the amplifier 5, the voltage Vcap3 held in the capacitors 3 is obtained, with the terminal 3a side as positive, by the following expression:

$$Vcap3 = Vout1 - Vout3 \tag{3}$$

If the expressions (1) and (2) are assigned to the above expression, the following expression will be obtained:

$$Vcap3 = Vin1 \times Ga/2 - Vref \tag{3}$$

The voltage at the terminal 4a side of the capacitor 4 is the output Vout2 from the amplifier 2, and the voltage at the terminal 4b side is V0 since the switch S2 is on. The voltage Vcap4 held in the capacitors 4 is obtained, with the terminal 4a side as positive, by the following expression:

$$Vcap4 = Vout2$$

If the expression (1) is assigned to the above expression, the following expression will be obtained:

$$Vcap4 = Vin2 \times Ga/2 \qquad (4)$$

Figure 3B:
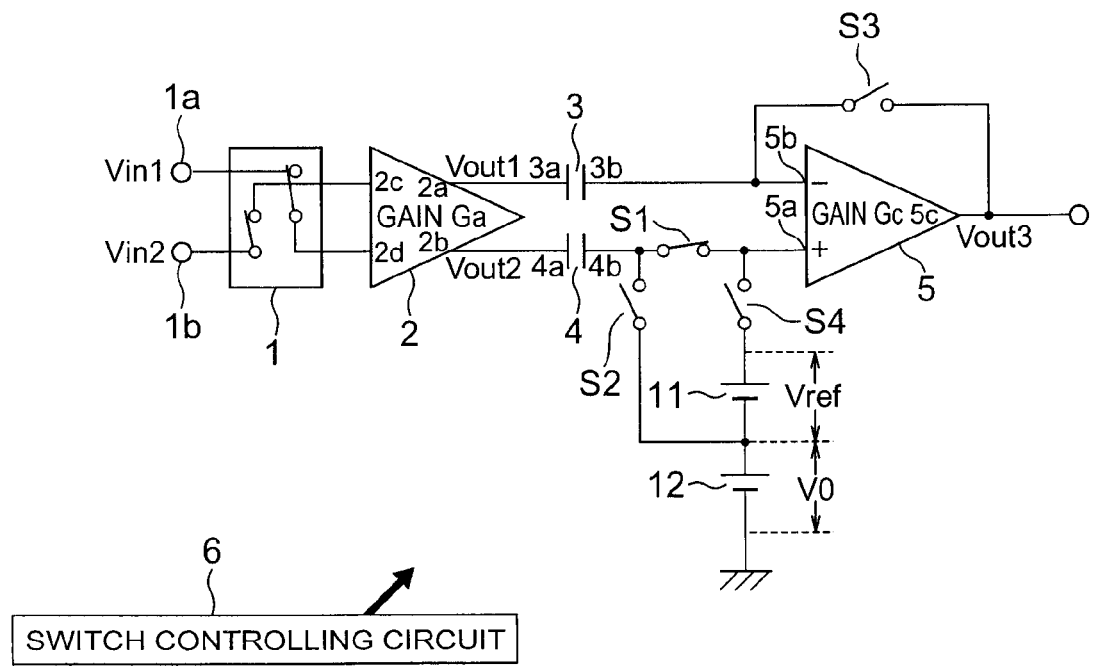
FIG. 3B is a schematic diagram in a comparison phase of the signal detecting circuit in accordance with the first embodiment.

FIG. 3B shows a switch connection state in the comparison phase. The voltage Vin2 is applied to the input terminal 2c of the amplifier 2; and the voltage Vin1 is applied to the input terminal 2d of the amplifier 2. Accordingly, the output voltages Vout1 and Vout2 from the amplifier 2 are obtained by the following expression respectively:

$$Vout1 = Vin2 \times Ga/2, \ Vout2 = Vin1 \times Ga/2 \qquad (5)$$

Since the switch S3 is off, the input voltage Vin3 in the inverting input terminal 5b of the amplifier 5 is obtained by subtracting the voltage Vcap3 held in the capacitor 3 in the sample phase from the output voltage Vout1 of the amplifier 2 as follows:

$$Vin3 = Vout1 - Vcap3$$

If the expressions (3) and (5) are assigned to the above expression, the following expression will be obtained:

$$Vin3 = (Vin2 \times Ga/2) - (Vin1 \times Ga/2 - Vref) = (Vin2 - Vin1) \times Ga/2 + Vref \qquad (6)$$

Since the switches S2 and S4 are off, and switch S1 is on, the input voltage Vin4 in the non-inverting input terminal 5a of the amplifier 5 is obtained by subtracting the voltage Vcap4 held in the capacitor 4 in the sample phase from the output voltage Vout2 of the amplifier 2 as follows:

$$Vin4 = Vout2 - Vcap4$$

If the expressions (4) and (5) are assigned to the above expression, the following expression will be obtained:

$$Vin4 = (Vin1 \times Ga/2) - (Vin2 \times Ga/2) = (Vin1 - Vin2) \times Ga/2 \qquad (7)$$

Since the gain of the amplifier 5 is Gc, the output voltage Vout3 of the amplifier 5 is obtained by the following expression:

$$Vout3 = (Vin4 - Vin3) \times Gc$$

If the expressions (6) and (7) are assigned to the above expression, the following expression will be obtained:

$$Vout3 = ((Vin1 - Vin2) \times Ga/2 - ((Vin2 - Vin1) \times Ga/2 + Vref)) \times Gc = ((Vin1 - Vin2) \times Ga - Vref) \times Gc \qquad (8)$$

From the expression (8), it is understood that the input signal (Vin1−Vin2) is multiplied by the gain Ga of the amplifier 2; the decision threshold voltage Vref is subtracted from the result; and the result is multiplied by the gain Gc of the amplifier 5, which is outputted from the amplifier 5. In other words, it is understood that the comparison result between the input signal (Vin1−Vin2) and the decision threshold voltage Vref is outputted from the amplifier 5.

Next, the offset component will be described. Assume that the input offset voltage at the terminal 2c side of the amplifier 2 is Vofs1; the input offset voltage at the terminal 2d side of the amplifier 2 is Vofs2; and the inter-input offset voltage of the amplifier 5 is Vofs3.

In the sample phase (FIG. 3A), the output voltages Vout1 and Vout2 are as follows:

$$Vout1 = Vofs1 \times Ga/2, \ Vout2 = Vofs2 \times Ga/2 \qquad (9)$$

Since the switch S3 is on, the amplifier 5 acts as a buffer. The input offset voltage component is outputted as is from the output terminal 5c of the amplifier 5 as follows:

$$Vout3 = Vofs3 \qquad (10)$$

The voltage at the terminal 3a side of the capacitor 3 is the output Vout1 from the amplifier 2, and the voltage at the terminal 3b side is Vout3 of the amplifier 5. The voltage Vcap3 held in the capacitors 3 is obtained, with the terminal 3a side as positive, by the following expression:

$$Vcap3 = Vout1 - Vout3$$

If the expressions (9) and (10) are assigned to the above expression, the following expression will be obtained:

$$Vcap3 = Vofs1 \times Ga/2 - Vofs3 \qquad (11)$$

The voltage at the terminal 4a side of the capacitor 4 is the output Vout2 from the amplifier 2, and the voltage at the terminal 4b side is V0. The voltage Vcap4 held in the capacitor 4 is obtained, with the terminal 4a side as positive, by the following expression:

$$Vcap4 = Vout2$$

If the expression (9) is assigned to the above expression, the following expression will be obtained:

$$Vcap4 = Vofs2 \times Ga/2 \qquad (12)$$

In the comparison phase (FIG. 3B), the output offset voltage components of the amplifier 2 are the same as in the sample phase. Thus, the output voltages Vout1 and Vout2 of the amplifier 2 are as follows:

$$Vout1 = Vofs1 \times Ga/2, \ Vout2 = Vofs2 \times Ga/2 \qquad (13)$$

Since the switch S3 is off, the input voltage Vin3 in the inverting input terminal 5b of the amplifier 5 is obtained by subtracting the voltage Vcap3 held in the capacitor 3 from the output voltage Vout1 of the amplifier 2 as follows:

$$Vin3 = Vout1 - Vcap3$$

If the expressions (11) and (13) are assigned to the above expression, the following expression will be obtained:

$$Vin3 = (Vofs1 \times Ga/2) - (Vofs1 \times Ga/2 - Vofs3) = Vofs3 \qquad (14)$$

Since the switches S2 and S4 are off, and switch S1 is on, the input voltage Vin4 in the non-inverting input terminal 5a of the amplifier 5 is obtained by subtracting the voltage Vcap4 held in the capacitor 4 from the output voltage Vout2 of the amplifier 2 as follows:

$$Vin4 = Vout2 - Vcap4$$

If the expressions (12) and (13) are assigned to the above expression, the following expression will be obtained:

$$Vin4 = (Vofs2 \times Ga/2) - (Vofs2 \times Ga/2) = 0 \qquad (15)$$

Since the gain of the amplifier 5 is Gc, the output voltage Vout3 of the amplifier 5 is obtained by the following expression:

$$Vout3 = (Vin4 - Vin3 + Vofs3) \times Gc$$

If the expressions (14) and (15) are assigned to the above expression, the following expression will be obtained:

$$Vout3 = (0 - Vofs3 + Vofs3) \times Gc = 0 \qquad (16)$$

From the expression (16), it is understood that the offset components of the amplifier 2 and the amplifier 5 are cancelled and thus no offset component is contained in the output from the amplifier 5.

As shown in FIG. 1, the signal detecting circuit in accordance with the above embodiment provide a direct connection between the output from the amplifier 2 and the capacitors 3 and 4 without a switch and the like interposed therebetween, and thus the potential change at the time of switching phases is not subject to the influence of the input offset of the amplifier 2. As described above, according to the signal detecting circuit in accordance with the present embodiment, the decision threshold voltage Vref can be set to an arbitrary value to cancel the influence of the offset component contained in the output, thereby assuring a high precision detection.

As shown in FIG. 1, the reference voltage source 12 is connected to the decision threshold voltage source 11 and the other end of the switch S2, but may be connected to the decision threshold voltage source 11 and the other end of the switch S4.

Figure 4:
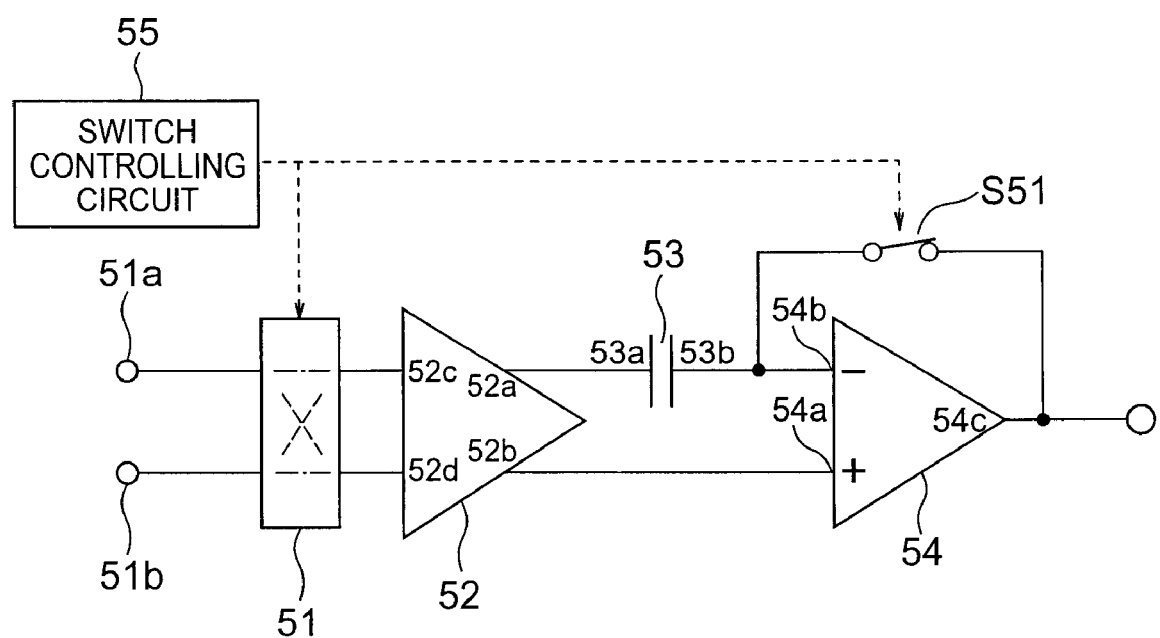
FIG. 4 is a block diagram showing a schematic configuration of the signal detecting circuit of a comparative example.

(Comparative example) FIG. 4 shows a schematic configuration of the signal detecting circuit of a comparative example. This signal detecting circuit is a combination of a chopper amplifier and an auto zero comparator to cancel the input offset voltage and noise of the amplifier and the comparator.

The signal detecting circuit includes a switching circuit 51 for switching an output destination of the input signal inputted from input terminals 51a and 51b; an amplifier 52 which receives an output from the switching circuit 51 at terminals 52c and 52d, and then amplifies and outputs from terminals 52a and 52b; a capacitor 53, a terminal 53a of which is connected to the output terminal 52a of the amplifier 52; a comparator 54, a non-inverting input terminal 54a of which is connected to the terminal 52b of the amplifier 52 and an inverting input terminal 54b of which is connected to the other terminal 53b of the capacitor 53; and switch S51, which is connected to between the output terminal 54c of the comparator 54 and a node between the other terminal 53b of the capacitor 53 and the inverting input terminal 54b of the comparator 54.

A switch controlling circuit 55 performs a connection switching of the switching circuit 51 and an on/off control of the switch S51.

In a first timing (sample phase), the switching circuit 51 enters a connection state in which a signal inputted from the input terminal 51a is applied to the terminal 52c of the amplifier 52, and a signal inputted from the input terminal 51b is applied to the input terminal 52d of the amplifier 52. In this timing, the switch S51 is on.

The capacitor 53 holds an output and an input offset of the amplifier 52, and an input offset of the comparator 54.

In a second timing (comparison phase), the switching circuit 51 enters a connection state in which a signal inputted from the input terminal 51a is applied to the terminal 52d of the amplifier 52, and a signal inputted from the input terminal 51b is applied to the input terminal 52c of the amplifier 52. In this timing, the switch S51 is off.

The voltage component held in capacitor 53 is subtracted from the reverse polarity output of the amplifier 52 to cancel other than the signal components (offset component and noise).

However, such a signal detecting circuit cannot allow a threshold voltage to be set to the comparator 54 or a threshold value for detecting the presence or absence of a signal to be set as an arbitrary value. In addition, it is considered to provide the input signal with an offset voltage corresponding to the threshold, but if the input signal is small, it is difficult to set a precise threshold value.

Second Embodiment

Figure 5:
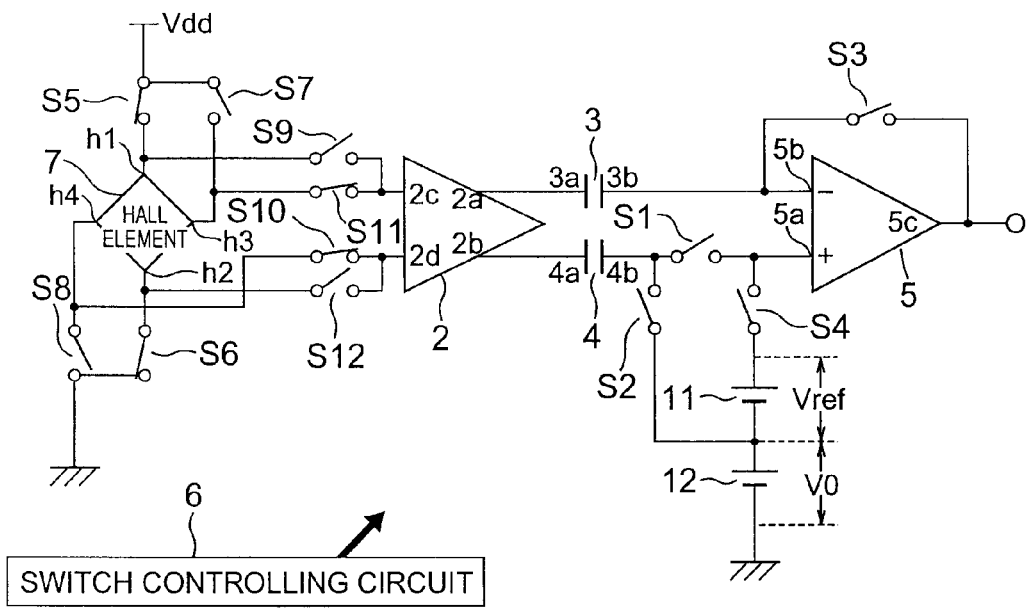
FIG. 5 is a block diagram showing a schematic configuration of the signal detecting circuit in accordance with a second embodiment.

FIG. 5 shows a schematic configuration of the signal detecting circuit in accordance with a second embodiment. The Hall element 7 has four terminals h1 to h4. A power supply voltage Vdd is applied to the terminals h1 and h3 via the switches S5 and S7 respectively. The terminals h2 and h4 are grounded via switches S6 and S8 respectively.

In addition, the terminals h1 and h3 of the Hall element 7 are connected to the terminal 2c of the amplifier 2 via the switches S9 and S11 respectively. The terminals h2 and h4 are connected to the terminal 2d of the amplifier 2 via the switches S10 and S12 respectively.

The description about the connection of the amplifier 2, the capacitors 3 and 4, the amplifier 5, the decision threshold voltage source 11, the reference voltage source 12, and switches S1 to S4 is omitted since they are the same as in the first embodiment.

A switch controlling circuit 6 performs an on/off control of the switches S1 to S12.

Figure 6:
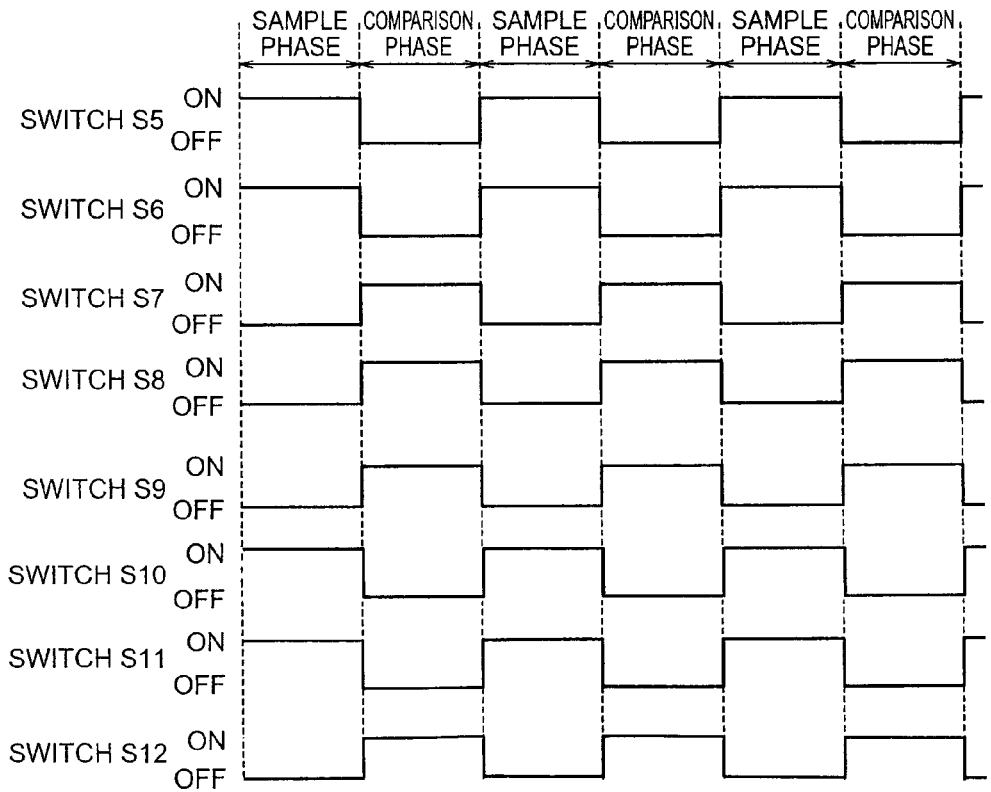
FIG. 6 is a timing chart showing an operation of the signal detecting circuit in accordance with the second embodiment.

FIG. 6 is a timing chart showing a connection state of each switch. One cycle of operation consists of a sample phase and a comparison phase in the same manner as in the first embodiment. The description about the connection state of the switches S1 to S4 is omitted since it is the same as the timing chart shown in FIG. 2.

In the sample phase, the switches S5, S6, S10, and S11 are on; and the switches S7, S8, S9, and S12 are off.

In this state, the power supply voltage Vdd is applied to between a pair of terminals h1 and h2 of the Hall element 7, and a drive current flows. A Hall electromotive force generated between a pair of terminals h3 and h4 becomes an input signal in the amplifier 2 via the switches S10 and S11.

In the comparison phase, the switches S7, S8, S9, and S12 are on; and the switches S5, S6, S10, and S11 are off.

In this state, the power supply voltage Vdd is applied to between a pair of terminals h3 and h4 of the Hall element 7, and a drive current flows. A Hall electromotive force generated between a pair of terminals h1 and h2 becomes an input signal in the amplifier 2 via the switches S9 and S12.

In this way, a pair of terminals to which the power supply voltage Vdd is applied can be switched by controlling the on/off state of the switches S5 to S7. Here, the polarity of the Hall electromotive force to be applied to the terminals 2c and 2d of the amplifier 2 is reversed between the sample phase and the comparison phase.

As is apparent from the first embodiment described above, the offset components of the amplifier 2 and the amplifier 5 are cancelled. Thus, the comparison result between the input signal (Hall electromotive force of the Hall element 7) without an offset component and the decision threshold voltage Vref is outputted from the amplifier 5.

In addition, the input signal (Hall electromotive force of the Hall element 7) to be compared with the decision threshold voltage Vref is a sum of the Hall electromotive force generated between a pair of terminals h1 and h2 and the Hall electromotive force generated between a pair of terminals h3 and h4. Since the effective signal components according to the strength of the magnetic field have the same phase, but the element offset components generated by the asymmetry of the Hall elements have the reverse phase between the Hall electromotive force generated between a pair of terminals h1 and h2 and the Hall electromotive force generated between a pair of terminals h3 and h4, it is also possible to reduce the element offset components by adding the two Hall electromotive forces.

As described above, according to the signal detecting circuit in accordance with the present embodiment, the decision threshold voltage Vref can be set to an arbitrary value to cancel the influence of the input offset component contained in the output, thereby assuring a high precision detection.

Figure 7A:
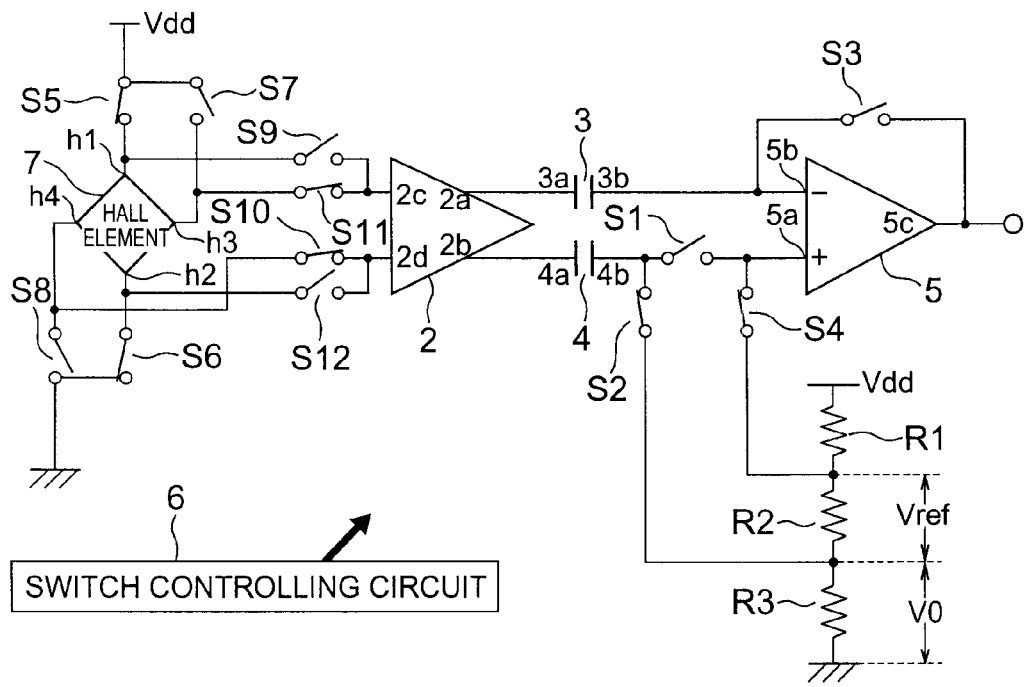
FIG. 7A is a block diagram showing a schematic configuration of the signal detecting circuit in accordance with a variation of the present invention.

The embodiments described above are shown by way of example only, and thus the present invention is not limited to the embodiments. For example, as shown in FIG. 7A, the power supply voltage Vdd of the Hall element is divided by registers R1 to R3 to produce the decision threshold voltage Vref and the reference voltage V0.

As a result, like the Hall electromotive force, the decision threshold voltage Vref is proportional to the power supply voltage Vdd. Accordingly, the threshold for detecting the magnetic field by the Hall element does not depend on the power supply voltage, thereby enabling a high precision magnetic sensor to be provided.

Figure 7B:
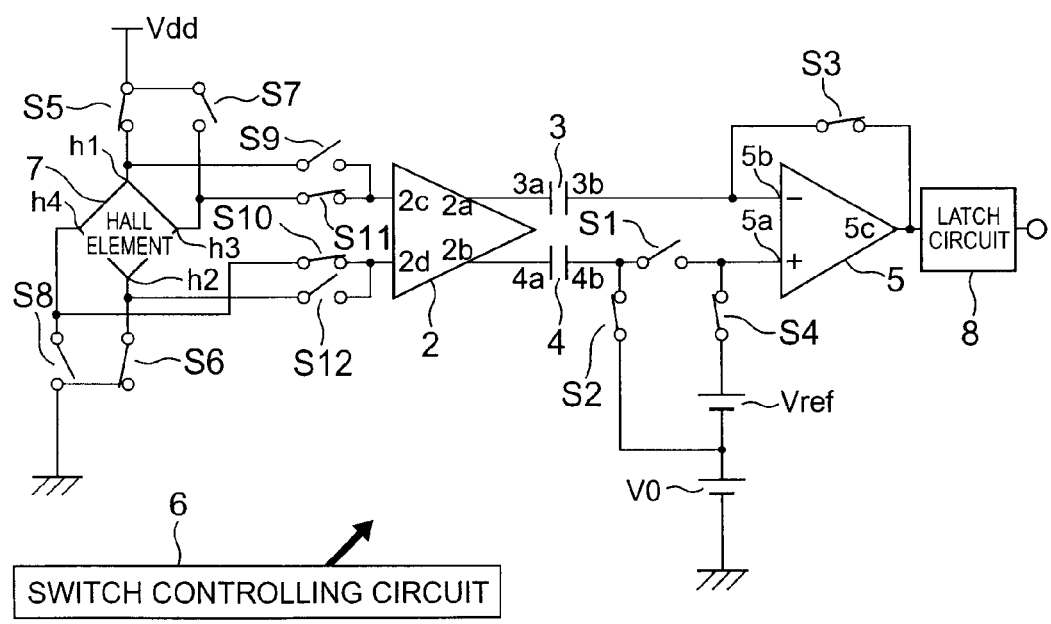
FIG. 7B is a block diagram showing a schematic configuration of the signal detecting circuit in accordance with a variation of the present invention.

Alternatively, as shown in FIG. 7B, a latch circuit 8 may be provided at the output terminal 5c of the amplifier 5. A precise decision result is not outputted during the period earlier than the response time of a circuit in the sample phase or in the comparison phase.

Therefore, it is possible to continue outputting a correct decision level by the latch circuit 8 holding a decision level outputted from the amplifier 5 in the immediately preceding comparison phase. The latch circuit 8 is controlled by the switch controlling circuit 6.

Figure 7C:
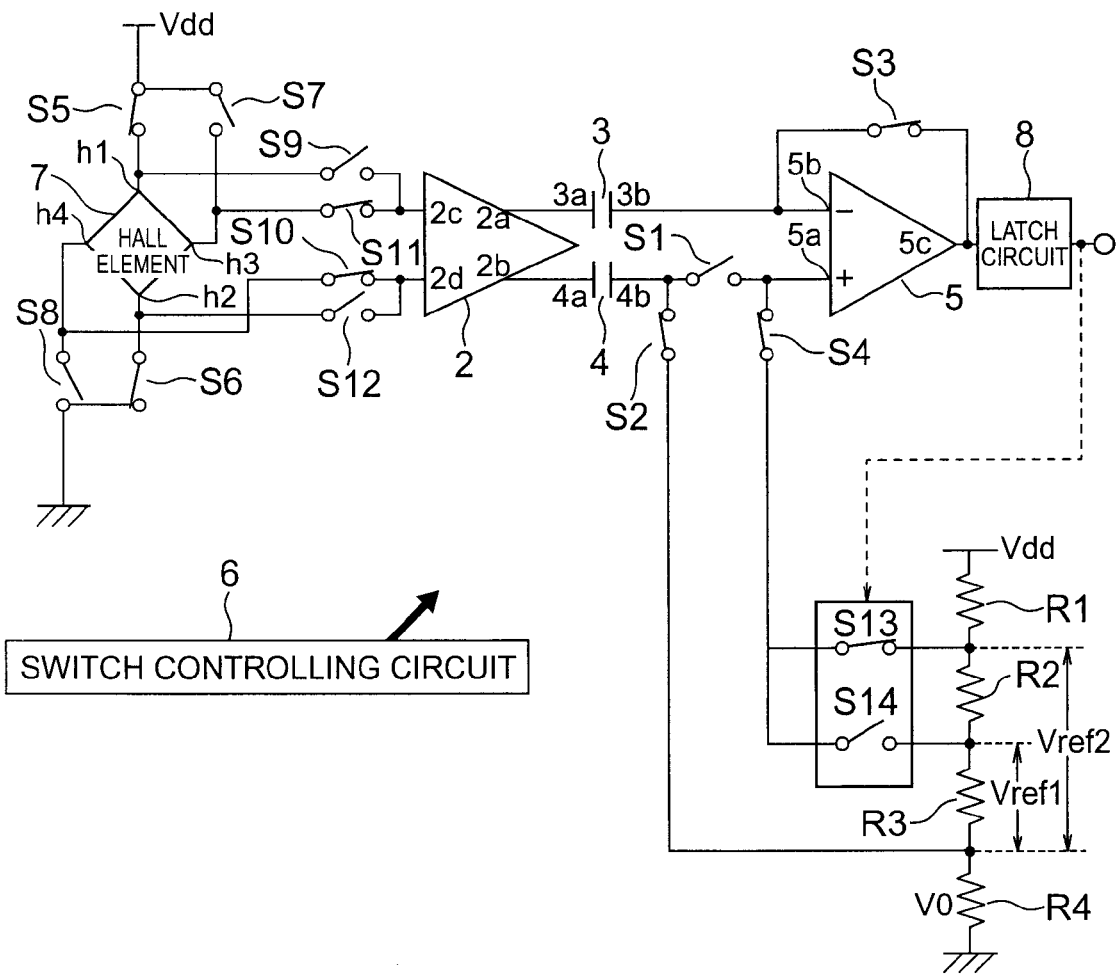
FIG. 7C is a block diagram showing a schematic configuration of the signal detecting circuit in accordance with a variation of the present invention.

In addition, as shown in FIG. 7C, the power supply voltage Vdd of the Hall element is divided by registers R1 to R4 to produce the two decision threshold voltages Vref1 and Vref2 (Vref1<Vref2). A hysteresis may be introduced in the detection threshold value by switching the detection threshold value by the switches S13 and S14. The on/off of the switches S13 and S14 is controlled according to the output of the latch circuit 8.

When the output of the latch circuit 8 indicates the detection state, the switch S13 is turned off and the switch S14 is turned on to enable the decision threshold voltage Vref1; and when the output of the latch circuit 8 indicates the non-detection state, the switch S13 is turned on and the switch S14 is turned off to enable the decision threshold voltage Vref2 to provide a higher detection threshold value.

Alternatively, according to the above embodiments, the comparison phase is adjacent to the sample phase, but an idle period may be provided in between the comparison phase and the sample phase to perform an intermittent operation to terminate the operation of the signal detecting circuit, thereby reducing the circuit power consumption.

Figure 8:
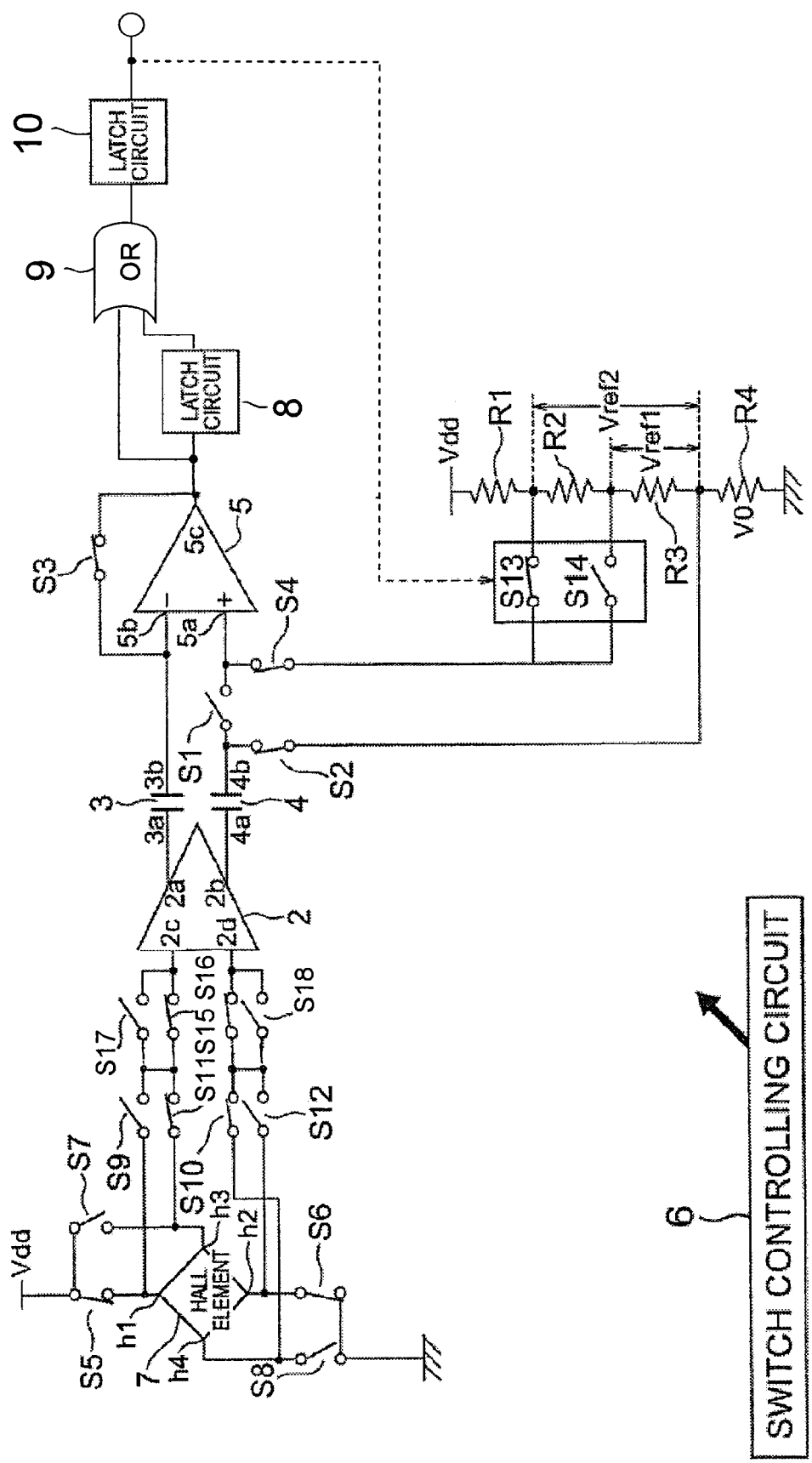
FIG. 8 is a block diagram showing a schematic configuration of the signal detecting circuit in accordance with a variation of the present invention.

Alternatively, as shown in FIG. 8, switches S15 to S18, an OR gate 9, a latch circuit 8, and a latch circuit 10 may be provided. A switch controlling circuit 6 performs an on/off control of the switches S1 to S12 and S15 to S18. The latch circuits 8 and 10 are controlled by the switch controlling circuit 6.

Figure 9:
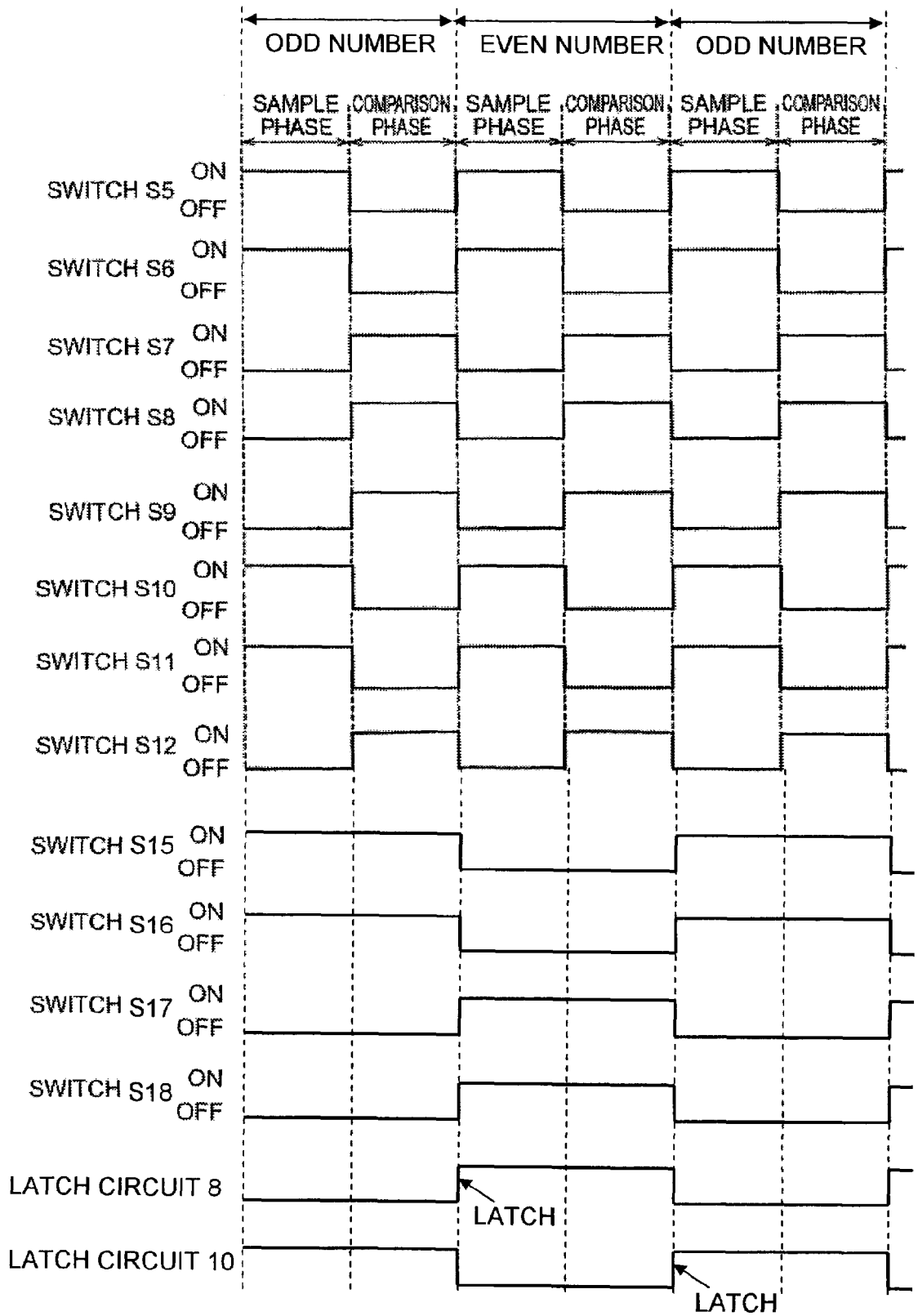
FIG. 9 is a timing chart showing an operation of the signal detecting circuit in accordance with a variation of the present invention.

FIG. 9 is a timing chart showing a connection state of each switch and an operation of the latch circuit 8 and 10. The description about the connection state of the switches S1 to S4 is omitted since it is the same as the timing chart shown in FIG. 2.

In a kth (k is an odd number equal to or larger than 1) sample phase and comparison phase, the switches S15 and S16 are on; and the switches S17 and S18 are off. In a jth (j is an even number equal to or larger than 2) sample phase and comparison phase, the switches S15 and S16 are off; and the switches S17 and S18 are on.

The connection state of the switches S5 to S12 is the same as the timing chart shown in FIG. 6.

The latch circuit 8 latches an output from the amplifier 5 at one end of the kth sample phase. The OR gate 9 is input an output from the amplifier 5 and an output from the latch circuit 8. The latch circuit latches an output from the OR gate 9 at one end of the jth sample phase. The on/off of the switches S13 and S14 is controlled according to the output of the latch circuit 10.

This signal detecting circuit can detect an absolute value of input signal strength regardless of the polarity of the input signal. Accordingly, matching of a polarity of a magnet is unnecessary when used as an open/close detecting device in combination with a magnet, thereby making device assembly easy.

What is claimed is:

1. A signal detecting circuit comprising:
a first signal input terminal and a second signal input terminal;
a first amplifier which has a first input terminal and a second input terminal and a first output terminal and a second output terminal, and which amplifies the signals inputted from said first input terminal and said second input terminal respectively and outputs the amplified signals from said first output terminal and said second output terminal;
a switch unit which connects the first input terminal of said first amplifier to said first signal input terminal, and said second input terminal to said second signal input terminal in a first period; and connects the second input terminal of said first amplifier to said first signal input terminal, and the first input terminal to said second signal input terminal in a second period;
a first capacitor, one end of which is connected to said first output terminal;
a second capacitor, one end of which is connected to said second output terminal;
a first switch, one end of which is connected to the other end of said second capacitor, and which is off in said first period, and which is on in said second period;
a second amplifier which has an inverting input terminal connected to the other end of said first capacitor, a non-inverting input terminal connected to the other end of said first switch, and a comparison result outputting terminal, and which compares the signals inputted from said inverting input terminal and said non-inverting input terminal respectively and outputs a comparison result from said comparison result outputting terminal;
a second switch which is connected to between said comparison result outputting terminal and said inverting input terminal, and which is on in said first period, and which is off in said second period;
a third switch, one end of which is connected to the other end of said second capacitor and one end of said first switch; and which is on in said first period, and which is off in said second period;
a fourth switch, one end of which is connected to the other end of said first switch and the non-inverting input terminal of said second amplifier; and which is on in said first period, and which is off in said second period;
a threshold voltage source which is connected to between the other end of said third switch and the other end of said fourth switch; and a reference voltage source which is connected to either one of the other end of said third switch and the other end of said fourth switch.

2. The signal detecting circuit according to claim 1, further comprising a latch circuit connected to the comparison result outputting terminal of said second amplifier, wherein said latch circuit latches an output from said comparison result outputting terminal at an end of said second period.

3. The signal detecting circuit according to claim 1, further comprising:
a Hall element having a first pair of terminals and a second pair of terminals which are arranged orthogonally with respect to each other;
a switching circuit which switches the pairs of terminals to which a predetermined voltage is applied, such that said predetermined voltage is applied to said first pair of terminals in said first period, and said predetermined voltage is applied to said second pair of terminals in said second period; and
a third signal input terminal and a fourth signal input terminal, wherein said first signal input terminal and said second signal input terminal are connected to said first pair of terminals respectively, and said third signal input terminal and said fourth signal input terminal are connected to said second pair of terminals respectively so as to reverse the polarity of said first pair of terminals; and said switch unit connects the first input terminal of said first amplifier to said third signal input terminal, and said second input terminal to said fourth signal input terminal in said first period, and connects the first input terminal of said first amplifier to said first signal input terminal, and the second input terminal to said second signal input terminal in said second period.

4. The signal detecting circuit according to claim 3, further comprising a latch circuit connected to the comparison result outputting terminal of said second amplifier, wherein said latch circuit latches an output from said comparison result outputting terminal at one end of said second period.

5. The signal detecting circuit according to claim 3, wherein said threshold voltage source and said reference voltage source divide said predetermined voltage by a plurality of resistors connected in series.

6. The signal detecting circuit according to claim 5, wherein said plurality of resistors connected in series comprises:
a first resistor, to one end of which said predetermined voltage is applied;
a second resistor, one end of which is connected to the other end of said first resistor and the other end of said fourth switch; and
a third resistor, one end of which is connected to the other end of said second resistor and the other end of said third switch.

7. The signal detecting circuit according to claim 5, further comprising a latch circuit connected to the comparison result outputting terminal of said second amplifier, and a fifth switch connected to between said threshold voltage source and the other end of said fourth switch, wherein said latch circuit latches the output from said comparison result outputting terminal at the end of said second period, and said fifth switch switches the terminals of said resistor connected to the other end of said fourth switch based on the output from said latch circuit.

8. The signal detecting circuit according to claim 7, wherein said plurality of resistors connected in series comprises:

a first resistor, to one end of which said predetermined voltage is applied;
a second resistor, one end of which is connected to the other end of said first resistor;
a third resistor, one end of which is connected to the other end of said second resistor;
a fourth resistor, one end of which is connected to the other end of said third resistor and the other end of said third switch, and the other end of which is connected to ground, wherein said fifth switch is connected to said one end or said other end of said second resistor based on the output from said latch circuit.

9. The signal detecting circuit according to claim 1, further comprising:
a first latch circuit connected to the comparison result outputting terminal of said second amplifier;
a logic circuit connected to the comparison result outputting terminal of said second amplifier and an outputting terminal of said first latch circuit, and implements a logical OR operation; and
a second latch circuit connected to the outputting terminal of said logic circuit, wherein said switch unit connects the second input terminal of said first amplifier to said first signal input terminal, and said first input terminal to said second signal input terminal in jth (j is an even number equal to or larger than 2) first period, and connects the first input terminal of said first amplifier to said first signal input terminal, and the second input terminal to said second signal input terminal in the jth second period, and the first latch circuit latches the output from said comparison result outputting terminal at the end of kth (k is an odd number equal to or larger than 1) second period, and the second latch circuit latches the output from said logic circuit at the end of the jth second period.

10. The signal detecting circuit according to claim 9, further comprising:
a Hall element having a first pair of terminals and a second pair of terminals which are arranged orthogonally with respect to each other;
a switching circuit which switches the pairs of terminals to which a predetermined voltage is applied, such that said predetermined voltage is applied to said first pair of terminals in said first period, and said predetermined voltage is applied to said second pair of terminals in said second period; and
a third signal input terminal and a fourth signal input terminal, wherein said first signal input terminal and said second signal input terminal are connected to said first pair of terminals respectively, and said third signal input terminal and said fourth signal input terminal are connected to said second pair of terminals respectively so as to reverse the polarity of said first pair of terminals; and said switch unit connects the first input terminal of said first amplifier to said third signal input terminal, and said second input terminal to said fourth signal input terminal in said kth first period, and connects the first input terminal of said first amplifier to said first signal input terminal, and the second input terminal to said second signal input terminal in the kth second period, and connects the first input terminal of said first amplifier to said fourth signal input terminal, and said second input terminal to said third signal input terminal in said jth first period, and connects the first input terminal of said first amplifier to said second signal input terminal, and the second input terminal to said first signal input terminal in the jth second period.

11. The signal detecting circuit according to claim 10, wherein said threshold voltage source and said reference voltage source divide said predetermined voltage by a plurality of resistors connected in series.

12. The signal detecting circuit according to claim 11, wherein said plurality of resistors connected in series comprises:
   a first resistor, to one end of which said predetermined voltage is applied;
   a second resistor, one end of which is connected to the other end of said first resistor and the other end of said fourth switch; and
   a third resistor, one end of which is connected to the other end of said second resistor and the other end of said third switch.

13. The signal detecting circuit according to claim 12, further comprising a fifth switch connected to between said threshold voltage source and the other end of said fourth switch, wherein said fifth switch switches the terminals of said resistor connected to the other end of said fourth switch based on the output from said second latch circuit.

* * * * *